United States Patent [19]

Janutka

[11] Patent Number: 4,500,802
[45] Date of Patent: Feb. 19, 1985

[54] THREE TERMINAL BIDIRECTIONAL SOURCE TO SOURCE FET CIRCUIT

[75] Inventor: William J. Janutka, West Allis, Wis.

[73] Assignee: Eaton Corporation, Cleveland, Ohio

[21] Appl. No.: 390,472

[22] Filed: Jun. 21, 1982

[51] Int. Cl.³ .................... H03K 17/04; H03K 17/66
[52] U.S. Cl. .................... 307/571; 307/270; 307/570; 307/577; 307/584; 363/60
[58] Field of Search .............. 307/499, 501, 246, 249, 307/250, 570, 571–575, 577, 584, 270, 318, 297, 252 A, 252 C, 252 D, 300; 330/288; 363/60

[56] References Cited

U.S. PATENT DOCUMENTS

| | | | |
|---|---|---|---|
| 3,215,859 | 11/1965 | Sorchych | 307/577 |
| 3,532,899 | 10/1970 | Huth et al. | 307/572 |
| 4,256,979 | 3/1981 | Hendrickson et al. | 307/571 |
| 4,347,445 | 8/1982 | Baker | 307/574 X |
| 4,394,590 | 7/1983 | Honda | 307/571 |

OTHER PUBLICATIONS

Siliconix, Inc., "Designing with Field-Effect Transistors", edited by A.D. Evans, published by McGraw-Hill Book Co., New York, 1981, pp. 207–215.

Primary Examiner—Stanley D. Miller
Assistant Examiner—David R. Hudspeth
Attorney, Agent, or Firm—Andrus, Sceales, Starke & Sawall

[57] ABSTRACT

A three terminal bidirectional FET circuit is provided by first and second MOSFETs connected source to source in series relation between first and second main terminals, and by gating circuitry including current source means connected to a gate terminal for driving the FETs into conduction. A resistor is connected between a point common to the FET sources and a point common to the FET gates and the current source, such that the gate to source voltage for each FET is the same regardless of the relative polarity of the main terminals.

15 Claims, 2 Drawing Figures 4,500,802

THREE TERMINAL BIDIRECTIONAL SOURCE TO SOURCE FET CIRCUIT

TECHNICAL FIELD

The invention relates to power switching FET circuits, and more particularly to a pair of FETs connected in source to source series relation in order to achieve bidirectional current handling capability, and further to gating techniques therefor.

BACKGROUND AND SUMMARY

Power switching field effect transistors (FETs) are well known in the art. A FET is unidirectional and conducts current from one main terminal to another in response to gate drive on a third terminal. This three terminal arrangement is widely accepted, and is compatible with standard circuit applications.

In order to control a load driven by an AC power source, a plural FET arrangement must be bidirectional, i.e. pass current in both directions. It is desirable that the plural FET circuit be a three terminal device which is compatible with most packaging techniques.

The present invention addresses and solves this need in a series source to source connected FET circuit with a particularly simple and effective gating arrangement.

DETAILED DESCRIPTION

Figure 1:
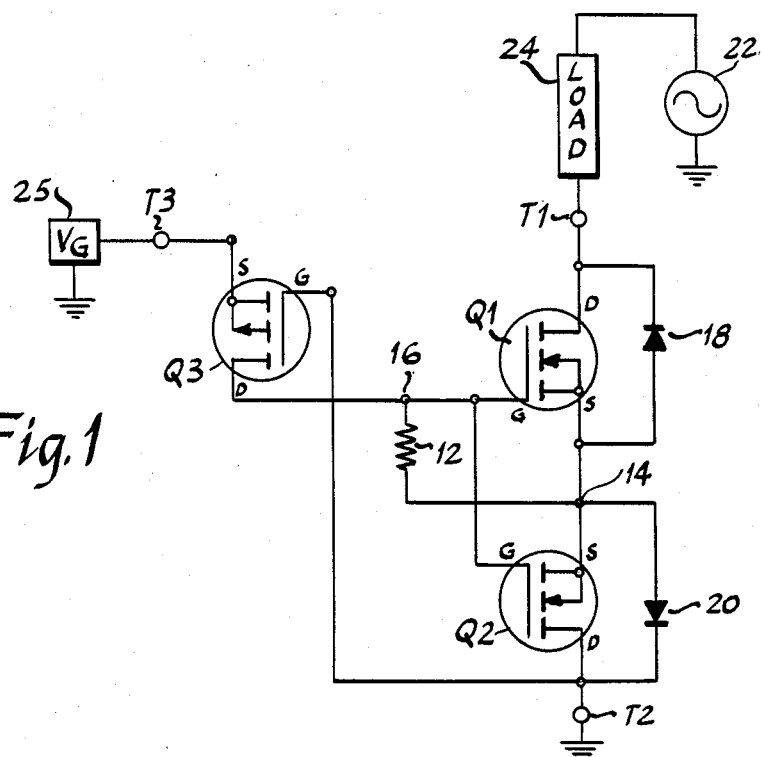
FIG. 1 is a circuit diagram of a bi-directional FET circuit constructed in accordance with the invention.

FIG. 1 shows a three terminal bidirectional FET circuit having first and second n channel enhancement mode FOSFETs Q1 and Q2 connected source to source in series relation between first and second main terminals T1 and T2. Current source means 10 is connected to the gates of the FETs for driving them into conduction. A current source supplies a constant fixed level of current independent of input voltage. A resistor 12 has one end connected to a common point 14 between the FET sources, and has its other end connected to a point 16 between current source 10 and a common point between the FET gates. The gate to source potential for each FET Q1 and Q2 is the product of the current through resistor 12 from current source 10 and the resistance value of resistor 12. This IR drop establishes the requisite gate to source voltage to drive the corresponding FET Q1 or Q2 into conduction regardless of the polarity of the corresponding main terminal T1 or T2.

FIG. 1 shows each of the FETs Q1 and Q2 with their inherent reverse characteristic diodes 18 and 20, as is known in the art. The main terminals are shown connected across an AC power source 22, a load 24 and ground. When the voltage of terminal T1 is positive with respect to T2, Q1 is the controlling FET and current flows from terminal T1 through Q1 and diode 20 to terminal T2 when the device is in the ON state. When the voltage on terminal T1 goes negative, current flows from terminal T2 through FET Q2 and diode 18 to terminal T1.

Current source 10 comprises a p channel source follower grounded gate MOSFET Q3. The source of Q3 is connected to a gate terminal T3 which is supplied from a gating voltage source 25. The drain of Q3 is connected to common gate point 16. Current source 10 may alternatively comprise a current mirror including for example a pair of PNP bipolar transistors connected base to base with commonly supplied emitters, the collector of one being connected to point 16, and the collector of the other being connected to the common bases and connected through a resistor to terminal T2. This type of current mirror is known in the art. Another alternative current source 10 is a zener regulated current source including for example a PNP bipolar transistor having its collector connected to point 16, its base connected through a zener to a voltage supply source, its emitter connected through a resistor to the voltage supply source, and its base also connected through a resistor to terminal T2. This type of zener regulated current source is known in the art.

Without the gating arrangement shown in FIG. 1, the required voltage to gate Q1 when terminal T1 is positive with respect to T2, is the gate to source voltage drop across Q1 plus the voltage across diode 20. When the voltage on terminal T1 goes negative with respect to T2, this negative voltage is now added to the requisite turn-on gate voltage of Q2. In order to maintain the same gate to source voltage, the requisite gate drive voltage for Q2 now becomes the gate to source voltage drop across Q2 plus the voltage drop across diode 18 plus the voltage on terminal T1. Current source 10 eliminates the effects of this latter T1 terminal voltage on the gate voltage. Using current source 10, the resulting gate to source voltage of both Q1 and Q2 will be the IR drop through resistor 12 which is fixed by the constant current. Referenced resistor 12 sets the voltage between points 16 and 14 to thus provide the same gate to source voltage for Q1 and Q2 regardless of the voltage on terminal T1.

Figure 2:
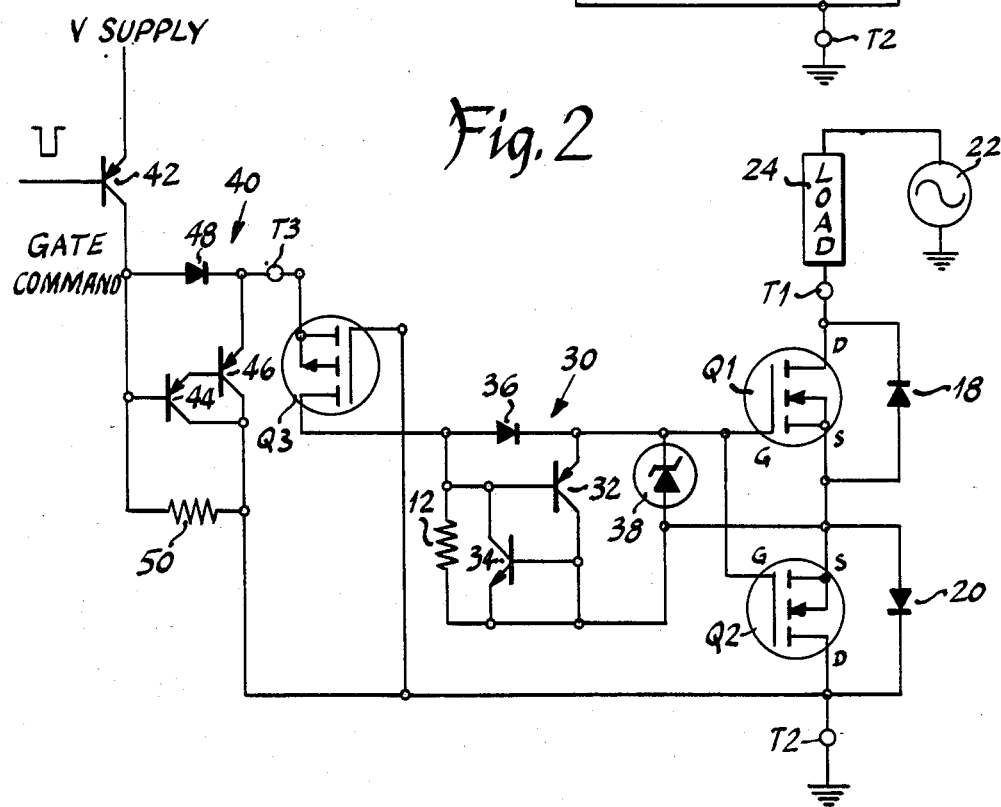
FIG. 2 shows a modification of the circuit of FIG. 1.

FIG. 2 shows a modification of the circuit of FIG. 1, and like reference numerals are used where appropriate for clarity. Circuitry 30 facilitates fast turnoff by rapidly draining the stored energy in the gate to source capacitance of FETs Q1 and Q2. Fast turn-off circuitry 30 includes bipolar PNP transistor 32 whose emitter to base junction is forward biased at turn-off of Q1 or Q2 due to the residual positive charge on the gates of the latter. Thus, when gate drive is removed from gate terminal T3, the base of transistor 32 goes low with respect to the emitter of transistor 32, whereby the latter goes into conduction. Current flowing through transistor 32 supplies base drive for an NPN bipolar transistor 34, driving the latter into conduction. Conduction of transistor 34 causes current to flow out of the base of transistor 32 whereby to latch transistor 32 and 34 into conduction in a regenerative loop. Conduction of transistors 32 and 34 thus discharges the gates of FETs Q1 and Q2 to thus facilitate faster turn-off thereof. Blocking diode 36 insures turn-on of transistors 32 and 34. Zener diode 38 provides over-voltage protection for the gates of Q1 and Q2.

Fast turn-off circuitry 40 is also provided to facilitate quicker turn-off of FET Q3. Upon removal of gating voltage $V_G$, for example by turn-off of control transistor 42, the base of PNP bipolar transistor 44 goes low with respect to its emitter which is connected to the base of another PNP bipolar transistor 46 in Darlington relation, such that transistors 44 and 46 are rendered conductive due to the relative positive charge on the emitter of transistor 46 which is connected to the source of FET Q3. Blocking diode 48 provides the requisite voltage drop between the emitter of transistor 46 and base of transistor 44, and resistor 50 provides the requisite return path, to enable to turn-on of Darlington transistor pair 44 and 46, to thus quickly discharge the residual positive stored charge in the source to gate capacitance in FET Q3.

Fast turn-off circuitry 30 may be used in place of circuitry 40 and vice versa. For example, Darlington pair 46 and 44 may be connected between a point common to the gates of FETs Q1 and Q2 and a point common to the FET sources, and have their base connected to the current source 10 at the drain of Q3. Transistor 46 then has its emitter connected to the point common to the gates of FETs Q1 and Q2, and its collector connected to the point common to the sources of FETs Q1 and Q2. A second transistor 44 has its emitter connected to the base of transistor 46, its base connected to current source 10 at the drain of Q3, and its collector connected to the point common to the sources of FETs Q1 and Q2.

It is recognized that various modifications are possible within the scope of the appended claims.

I claim:

1. A bidirectional FET circuit comprising:
   first and second enhancement mode FETs connected source to source in series relation between first and second power switching terminals, current conduction in one direction traversing through the series connection of the drain-source current path of said first FET and the forward biased substrate-drain pn junction of said second FET, and current conduction in the opposite direction traversing through the series connection of the drain-source current path of said second FET and the forward biased substrate-drain pn junction off said first FET; and
   current source means for supplying a constant fixed level of current independent of input voltage, and including resistance means, connected to the gates of said FETs for driving them into conduction;
   wherein said resistance means comprises a resistor having one end connected to a node connecting said FET sources, and having the other end connected to a node connecting said current source and a node connecting said FET gate, such that the gate to source potential for each FET is the product of the current through said resistor from said current source means and the resistance value of said resistor, regardless of the polarity of the corresponding power switching terminal.

2. The invention according to claim 1 wherein said current source means comprises a source follower FET connected between said other end of said resistor and a switch control terminal for receiving a control potential, said last mentioned FET having its gate connected to one of said power switching terminals, one of its drain and source connected to said other end of said resistor, and the other of its drain and source connected to said switch control terminal.

3. The invention according to claim 2 wherein:
   said power switching terminals are connectable to the series connection of an AC power source and a load, with one of said power switching terminals referenced to ground;
   said switch control terminal is connectable to a source of gate voltage referenced to ground; and
   said last mentioned FET comprises a p channel MOSFET having its gate connected to ground, its drain connected to said other end of said resistor, and its source connected to said switch control terminal.

4. The invention according to claim 1 wherein said current source means comprises a current mirror.

5. The invention according to claim 1 wherein said current source means comprises a zener diode regulated current source.

6. A three terminal bidirectional FET circuit comprising:
   first and second enhancement mode FETs connected source to source in series relation between first and second power switching terminals, said terminals being connectable to the series connection of an AC power source and a load, current conduction in one direction traversing through the series connection of the drain-source current path of said first FET and the forward biased substrate-drain pn junction of said second FET, and current conduction in the opposite direction traversing through the series connection of the drain-source current path of said second FET and the forward biased substrate-drain pn junction of said first FET;
   current source means for supplying a constant fixed level of current independent of input voltage, connected between the gates of said FETs and a switch control terminal;
   resistance means connected between a node connecting said FET sources and a node connecting said FET gates, such that the gate to source voltage for each FET is the same regardless of the polarity of one said power switching terminal relative to the other;
   wherein said current source means comprises a source follower mode grounded gate FET connected between said switch control terminal and a node connecting said resistance means and said FET gates, said last mentioned FET having its gate referenced to ground, one of its drain and source connected to said node connecting said resistance means and said FET gates, and the other of its drain and source connected to said switch control terminal.

7. A three terminal bidirectional FET circuit comprising:
   first and second enhancement mode FETs connected source to source in series relation between first and second power switching terminals, said terminals being connectable to the series connection of an AC power source and a load, current conduction in one direction traversing through the series connection of the drain-source current path of said first FET and the forward biased substrate-drain pn junction of said second FET, and current conduction in the opposite direction traversing through the series connection of the drain-source current path of said second FET and the forward biased substrate-drain pn junction of said first FET;
   current source means for supplying a constant fixed level of current independent of input voltage, connected between the gates of said FETs and a switch control terminal;
   resistance means connected between a node connecting said FET sources and a node connecting said FET gates, such that the gate to source voltage for each FET is the same regardless of the polarity of one said power switching terminal relative to the other;
   fast turn-off circuitry for said FETs, comprising transistor means biased into conduction by removal of gate drive from said switch control terminal and by residual stored charge in the gate to source capacitance of said FETs, said transistor means in a conductive state draining said residual charge from said FET gates.

8. The invention according to claim 7 wherein said transistor means comprises a pair of regeneratively coupled bipolar transistors driven into latched conduction by the residual stored charge on said FET gates in combination with the absence of gate current from said switch control terminal.

9. The invention according to claim 8 wherein said bipolar transistors comprise a first PNP transistor having its emitter connected to said node connecting said FET gates and having its base connected to said current source means, and an NPN transistor having its base connected to the collector of said PNP transistor, its collector connected to the base of said PNP transistor, and its emitter connected to said node connecting said FET sources.

10. The invention according to claim 7 wherein said transistor means of said fast turn-off circuitry comprises a pair of bipolar transistors connected in Darlington relation between said node connecting said FET gates and said node connecting said FET sources, and having one of their emitter and collector connected to said node connecting said FET gates, and the other of their emitter and collector connected to said node connecting said FET sources, and having a base connected to said current source means.

11. The invention according to claim 10 wherein said Darlington transistor pair comprises a first PNP transistor having its emitter connected to said node connecting said FET gates and its collector connected to said node connecting said FET sources, and a second PNP transistor having its emitter connected to the base of said first PNP transistor, its base connected to said current source means, and its collector connected to said node connecting said FET sources.

12. The invention according to claim 6 further comprising fast turn-off circuitry for said FETs, comprising transistor means biased into conduction by removal of gate drive from said switch control terminal and by residual stored charge in the gate to source capacitance of said FETs, said transistor means in a conductive state draining said residual charge from said FET gates.

13. The invention according to claim 12 wherein said transistor means comprises a pair of regeneratively coupled bipolar transistors driven into latched conduction by the residual stored charge on said FET gates in combination with the absence of gate current from said switch control terminal, said bipolar transistors comprising a first PNP transistor having its emitter connected to said node connecting said FET gates and having its base connected to the drain of said source follower mode grounded gate FET, and comprising an NPN transistor having its base connected to the collector of said PNP transistor, its collector connected to the base of said PNP transistor, and its emitter connected to said node connecting said FET sources.

14. The invention according to claim 12 wherein said transistor means of said fast turn-off circuitry comprises a pair of bipolar transistors connected in Darlington relation between said node connecting said FET gates and said node connecting said FET sources, and having a base connected to the drain of said source follower mode grounded gate FET, said Darlington transistor pair comprising a first PNP transistor having its emitter connected to said node connecting said FET gates and its collector connected to said node connecting said FET sources, and comprising a second PNP transistor having its emitter connected to the base of said first PNP transistor, its base connected to said drain of said source follower mode grounded gate FET, and its collector connected to said node connecting said FET sources.

15. The invention according to claim 7 wherein said current source means comprises a current mirror.

* * * * *